(12) United States Patent
Kamitani

(10) Patent No.: US 6,674,295 B1
(45) Date of Patent: Jan. 6, 2004

(54) IMPEDANCE MEASURING APPARATUS FOR ELECTRONIC COMPONENT

(75) Inventor: Gaku Kamitani, Otsu (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/629,628

(22) Filed: Jul. 31, 2000

(30) Foreign Application Priority Data

Aug. 5, 1999 (JP) .......................................... 11-221995

(51) Int. Cl.[7] .............................................. G01R 27/04
(52) U.S. Cl. ...................................... 324/713; 324/691
(58) Field of Search ............................... 324/421, 704, 324/649, 720, 611, 715, 713, 537, 500, 538, 693, 691

(56) References Cited

U.S. PATENT DOCUMENTS

| | | | | |
|---|---|---|---|---|
| 4,175,253 A | * | 11/1979 | Pitegoff | ....................... 324/713 |
| 4,876,515 A | | 10/1989 | Ball | |
| 4,954,782 A | | 9/1990 | Ball | |
| 5,057,772 A | | 10/1991 | Bruno et al. | |
| 5,216,373 A | * | 6/1993 | Wakamatsu et al. | ........ 324/720 |
| 5,345,182 A | * | 9/1994 | Wakamatsu | ................. 324/649 |
| 5,463,323 A | * | 10/1995 | Wakamatsu | ................. 324/611 |
| 5,600,249 A | | 2/1997 | Yagi et al. | |
| 5,627,476 A | * | 5/1997 | Chamber | ..................... 324/704 |
| 6,160,402 A | * | 12/2000 | Naglich et al. | ............. 324/421 |

FOREIGN PATENT DOCUMENTS

| | | |
|---|---|---|
| JP | 2-232568 | 9/1990 |
| JP | 4-5576 | 1/1992 |

* cited by examiner

Primary Examiner—Vinh P. Nguyen
(74) Attorney, Agent, or Firm—Burns, Doane, Swecker & Mathis, LLP

(57) ABSTRACT

An impedance measuring apparatus for an electronic component measures the impedance of the electronic component using a four-terminal method. The impedance measuring apparatus for the electronic component includes a first current-carrying line and a first voltage detection line connected to one electrode of the electronic component. A first resistor establishes a connection between the first current-carrying line and the first voltage detection line. A second current-carrying line and a second voltage detection line are connected to the other electrode of the electronic component. A second resistor establishes a connection between the second current-carrying line and the second voltage detection line. In the impedance measuring apparatus, the first resistor and the second resistor have sufficiently high resistances compared to contact resistances occurring among the electrodes of the electronic component, the current-carrying lines, and the voltage detection lines.

7 Claims, 4 Drawing Sheets

IMPEDANCE MEASURING APPARATUS FOR ELECTRONIC COMPONENT

BACKGROUND OF THE INVENTION

The priority document for this application, Japanese Patent Application No. 11-221995, is herein incorporated by reference in its entirety, all essential material having been set forth in the specification.

1. Field of the Invention

The present invention relates to an impedance measuring apparatus for an electronic component using a four-terminal method (Kelvin method).

To simplify the description in this specification, an example has been chosen involving the measurement of a resistance to which DC signals are applied. Due to the natures of DC, the only parasitic parameters generated in a circuit are resistance components. When measurement is applied in the case of AC signals, though the parasitic parameters become impedances which are denoted using complex numbers, the concepts are akin to those for the measurement using DC signals.

2. Description of the Related Art

Hitherto, a two-terminal method, as shown in FIG. 1, is used to measure the impedance of an electronic component. In this case, a measured value of the impedance can be measured as $R_M = V/I$. $R_M$, which is measured using this method, includes contact resistances $R_H$ and $R_L$ occurring in measurement cables (or terminals), other than the impedance $R_{dut}$ of the electronic component, which is a measurement object. This contact resistance includes lead-wire resistances of the measurement cables or the like. $R_M$ may be expressed as:

$$R_M = V/I = R_{dut} + R_H + R_L$$

When $R_H$ and $R_L$ are very high relative to $R_{dut}$, making the value of $R_{dut}$ negligible, a measurement error results. The contact resistances $R_H$ and $R_L$ vary whenever contact occurs between the measurement object and the measurement terminals. Accordingly, the influence of $R_H$ and $R_L$ cannot be removed by means of compensation or the like.

When the measurement error caused by the contact resistances $R_H$ and $R_L$ is not negligible, such as a case in which the measurement object has a low impedance, the measurement may be performed using a four-terminal method, as shown in FIG. 2. In this method, the measured value $R_M = V/I = R_{dut}$ is obtained, and $R_H$ and $R_L$ are avoided as measurement error factors.

However, there are problems in the four-terminal method when contact failure occurs at voltage detection lines ($H_p$, $L_p$). For example, when many measurement objects are measured one after another, the $H_p$ line is subject to contact failure, as shown in FIG. 3. If stray capacitance $C_{HP}$ is generated on the $H_p$ line at this time, the stray capacitance appears to have been charged by the voltage obtained on the measurement object before the present measurement of current was obtained. When a measurement object is measured in this state, the following expression is obtained.

$$R_M = V(\text{previous voltage})/I(\text{present current}) = R_{dut} \tag{1}$$

The value obtained in this manner is not the resistance of the measurement object currently intended to be measured, as it is influenced by the most recent normal measurement of the measurement object. There is a possibility that measurement failure may occur on the $L_p$ line as well as the $H_p$ line, for similar reasons.

Therefore, when a contact failure occurs on a voltage detection line, the measured resistance value is not accurate when a "pure" four-terminal method is used. Because such inaccuracies, there is a risk of delivering defective products instead of good products. In regard to current measurement, when a contact failure occurs at a current-carrying line $H_c$ or $L_c$, measurement cannot be performed since the current $I$ becomes zero.

It is desirable to use a voltage detection unit having a high input impedances $R_{INH}$ and $R_{INL}$ in the measuring apparatus, yet the input impedances are not infinite. In addition, since the impedance of stray capacitance of the measurement cable is inserted so as to be in parallel, the input impedance is decreased. Accordingly, the voltage detected at the voltage detection unit is voltage-divided by the contact resistances $R_{HP}$ and $R_{LP}$, and $R_{INH}$ and $R_{INL}$. When $R_{HP}$ and $R_{LP}$ become too high to be negligible, a measurement error occurs. Since $R_{HP}$ and $R_{LP}$ vary when contact occurs between the measurement object and the measurement cables, the measurement error due to this cannot be removed by means of a method such as compensation. Furthermore, when measurement using AC signals is performed, there is a possibility that measurement failure may occur because of electrostatic coupling or electromagnetically inductive coupling among the $H_c$ and $L_c$ lines, and the $H_p$ and $L_p$ lines.

SUMMARY OF THE INVENTION

Accordingly, it is an object of the present invention to provide an impedance measuring apparatus for an electronic component in which use of a simple circuit prevents a defective product from being inadvertently determined as a good product when contact failure occurs at a measurement terminal thereof.

It is another object of the present invention to provide an impedance measuring apparatus for an electronic component which decreases the measurement error due to contact resistance.

To this end, according to a first aspect of the present invention, there is provided an impedance measuring apparatus for an electronic component that measures the impedance of the electronic component using a four-terminal method. The impedance measuring apparatus for the electronic component includes a first current-carrying line and a first voltage detection line connected to one electrode of the electronic component; a first resistor establishing a connection between the first current-carrying line and the first voltage detection line; a second current-carrying line and a second voltage detection line connected to the other electrode of the electronic component; and a second resistor establishing a connection between the second current-carrying line and the second voltage detection line. In the impedance measuring apparatus, the first resistor and the second resistor have sufficiently high resistances compared to contact resistances occurring among the electrodes of the electronic component, the current-carrying lines, and the voltage detection lines.

According to a second aspect of the present invention, there is provided an impedance measuring apparatus for an electronic component for measuring the impedance of the electronic component using a four-terminal method. The impedance measuring apparatus for the electronic component includes a first current-carrying line connected to one electrode of the electronic component and a first voltage detection line connected to the other electrode thereof; a first resistor establishing a connection between the first current-carrying line and the first voltage detection line; a second current-carrying line connected to the other electrode of the electronic component and a second voltage detection line connected to the one electrode thereof; and a second resistor establishing the second current-carrying line and the second voltage detection line. In the impedance measuring apparatus, the first resistor and the second resistor have sufficiently high resistances compared to contact resistances occurring among the electrodes of the electronic component, the current-carrying lines, and the voltage detection lines.

The impedance measuring apparatus according to the first aspect of the present invention may be used to effectively determine whether a product is defective or not when the impedance thereof is higher than a standard value. That is, in a measuring apparatus according to the first aspect of the present invention, when the measuring terminals and the electronic component are in good contact with each other, the result is a measurement equivalent to the four-terminal method, and the measured value is the impedance of the electronic component. If any of the measuring terminals fails to be in contact with the electronic component, the result is that the measurement method is converted from the equivalent of a four-terminal method to a two-terminal method at an electrode unit in which contact failure occurs. When contact failure occurs, the measured value is increased by the corresponding amount of the contact resistances. By pulling-up the voltage detection lines, contact failure may be estimated, to reduce or eliminate the risk of delivering defective products as good products.

When contact failure occurs, it is desired to estimate the location of the contact failure. In accordance with a further embodiment of the present invention, a third resistor may be connected to the current-carrying line provided between the one electrode of the electronic component and the first resistor; and a fourth resistor may be connected to the current-carrying line provided between the other electrode of the electronic component and the second resistor. Preferably, the resistances of the third and fourth resistors are sufficiently lower than the first and second resistors, and are sufficiently higher than the contact resistances, with the resistors each having a different resistance value. In this case, by changing the resistances of the third resistor and the fourth resistor, it is possible to estimate at which voltage terminal contact failure occurs.

In addition to connecting resistors to the current-carrying lines, a fifth resistor and a sixth resistor may be connected to the voltage detection lines. By setting the resistances of the third to the sixth resistors so as to be different from one another, it is possible to estimate every location of the occurrence of contact failure.

The impedance measuring apparatus according to the second aspect of the present invention may be used to effectively determine whether a product is defective or not when the impedance thereof is lower than a standard value. That is, in a measuring apparatus according to the second aspect of the present invention, when contact failure occurs on any of the measuring terminals, the measured value is decreased by an amount corresponding to the contact resistances. By pulling-down the voltage detection lines, contact failure may be estimated, to reduce or eliminate the risk of delivering defective products as good products.

In the impedance measuring apparatus according to the first or the second aspect of the present invention, it is desirable to have a sufficiently high input impedance of a voltage detection unit of the measuring apparatus. When measurement is performed using AC signals by means of the four-terminal method, there is a case in which a measuring apparatus has a high input impedance using a DC signal, yet has low input impedance for an AC signal due to input capacitance. In addition, even though the input impedance of the measuring apparatus is high, the input impedance thereof is lowered due to stray capacitance of a measurement cable. In these cases, preferably, by inserting a voltage follower having a high input impedance ahead of an input unit of the measuring apparatus, the influence due to contact failure is lessened, which can decrease the measurement error.

The voltage follower is preferably provided on at least the higher-voltage detection side of the voltage detection lines. It may be provided on the lower-voltage detection side of the voltage detection lines when necessary.

In addition, the impedance measurement can be performed by inserting resistors in the measuring circuit. Since no particular contact detection circuit is required, the measuring apparatus in accordance with the present invention may advantageously be realized with low cost.

DESCRIPTION OF THE PREFERRED EMBODIMENT

Figure 1:
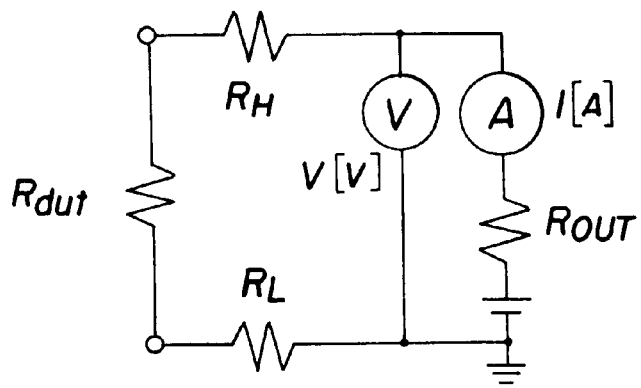
FIG. 1 is a circuit diagram of an impedance measuring apparatus using a conventional two-terminal method.
Figure 2:
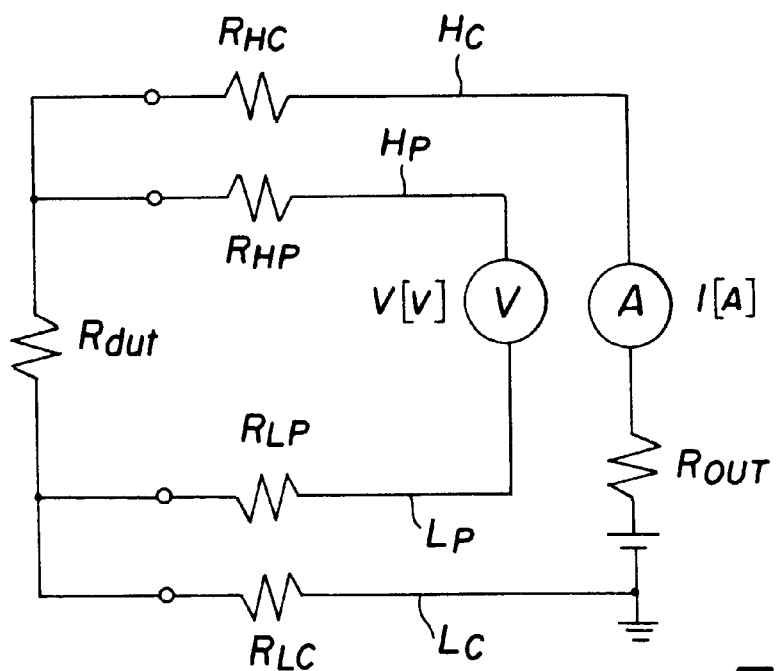
FIG. 2 is a circuit diagram of an impedance measuring apparatus using a conventional four-terminal method.
Figure 3:
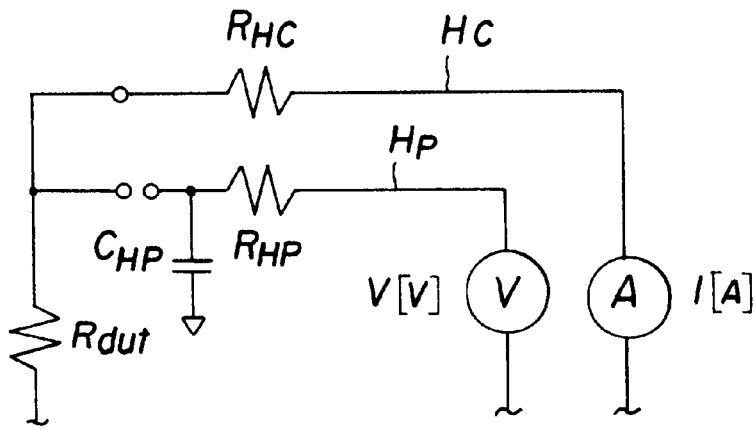
FIG. 3 is a circuit diagram in a case in which contact failure occurs on a voltage detection line using the conventional four-terminal method.
Figure 4:
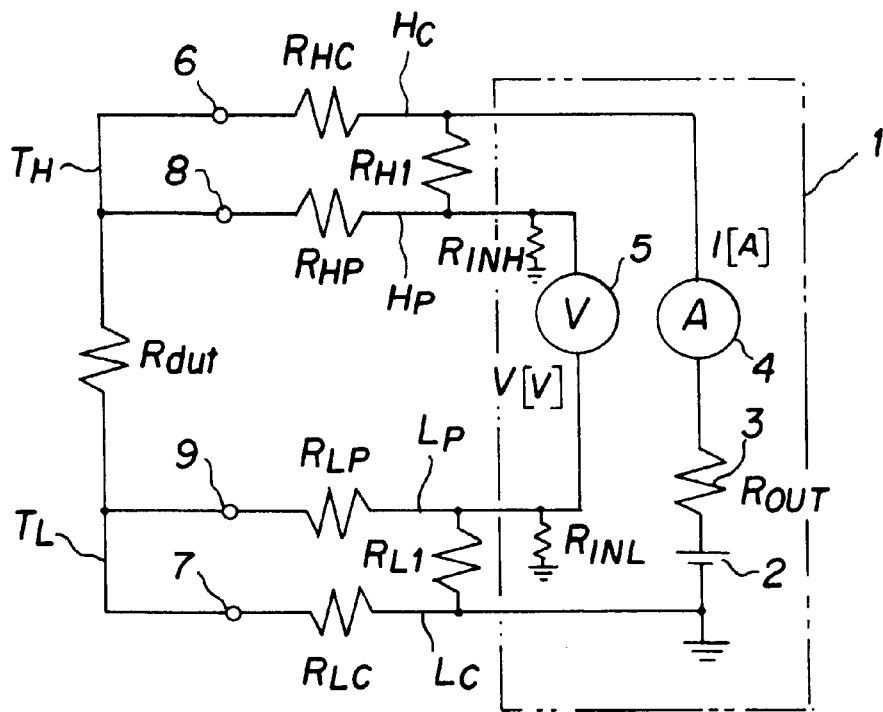
FIG. 4 is a circuit diagram of a first embodiment of the impedance measuring apparatus according to the present invention.

FIG. 4 shows a first embodiment of an impedance measuring apparatus using a four-terminal method according to the present invention. This measuring apparatus is used for estimating whether a product is defective in a case in which, for example, an inductor is defective when the impedance thereof is higher than a standard value.

In the figure, $R_{dut}$ is an electronic component, which is a measurement object, and $T_H$ and $T_L$ are electrodes of the measurement object $R_{dut}$. An impedance measuring apparatus 1 includes a current source 2 (here, it is represented as a direct-current source, yet it may be an alternating-current source), an internal resistor 3, an ammeter 4, and a voltmeter 5. The current source 2 is connected to current terminals 6 and 7 via current-carrying lines $H_c$ and $L_c$, respectively, and the voltmeter 5 is connected to voltage terminals 8 and 9 via voltage detection lines $H_p$ and $L_p$, respectively. The current terminal 6 and the voltage terminal 8 are constructed so as to be in contact with one electrode $T_H$, while the current terminal 7 and the voltage terminal 9 are constructed so as to be in contact with the other electrode $T_L$.

$R_{HC}$ and $R_{LC}$ are contact resistances generated between the current terminal 6 and the electrode $T_H$, and between the current terminal 7 and the electrode $T_L$, respectively, each of which includes a lead-wire resistor of a measurement cable or the like forming the corresponding current-carrying line $H_c$ or $L_c$. A first resistor $R_{H1}$ is connected between the current-carrying line $H_c$ and the voltage detection line $H_p$, which are connected to one electrode $T_H$, and a second resistor $R_{L1}$ is connected between the current-carrying line $L_c$ and the voltage detection line $L_p$, which are connected to the other electrode $T_L$. The resistances (for example, 100 k$\Omega$) of the first and second resistors $R_{H1}$ and $R_{L1}$ are preferably set to be sufficiently higher than resistances (normally, equal to or below 10 $\Omega$) which are normal for the contact resistances $R_{HC}$, $R_{LC}$, $R_{HP}$, and $R_{LP}$. That is, it is preferred that the resistances are related as follows.

$$R_{H1} \gg R_{HC}, R_{HP}$$

$$R_{L1} \gg R_{LC}, R_{LP}$$

Here, input impedances $R_{INH}$ and $R_{INL}$ of the voltmeter 5 of the measuring apparatus 1 are assumed to be sufficiently high.

The measured value $R_M$ of the above-described measuring apparatus 1 is given by the following expression.

$$R_M = V/I = R_{dut} + R_{HC}R_{HP}/(R_{HC}+R_{HP}+R_{H1}) + R_{LC}R_{LP}/(R_{LC}+R_{LP}+R_{L1}) \quad (2)$$

When the above-described measurement terminals 6 to 9 are in good contact with the measurement object $R_{dut}$ ($R_{HC}$, $R_{LC}$, $R_{HP}$, and $R_{LP}$ are, for example, below 10 $\Omega$), the measurement is equivalent to the one using a normal four-terminal method. Since the second and third terms of the above-described expression become approximately zero, $R_M = V/I = R_{dut}$ is obtained.

When the voltage terminals 8 and 9 are not in contact with the measurement object, in other words, when contact failure occurs on the voltage detection line $H_p$ and/or $L_p$, the measured value is as follows. When the voltage terminal 8 (the $H_p$ line) is not in contact with the measurement object, $R_M = V/I = R_{dut} + R_{HC}$. When the voltage terminal 9 (the $L_p$ line) is not in contact with the measurement object, $R_{M=V/I} = R_{dut} + R_{LC}$. When neither of the voltage terminals 8 and 9 (the $H_p$ and $L_p$ lines) are contact with the measurement object, $R_M = V/I = R_{dut} + R_{HC} + R_{LC}$.

In accordance with the present invention, when contact failure occurs, the measured value may be increased by the corresponding amount of the contact resistances by pulling-up the voltage detection lines. In this way, the present invention is able to more accurately determine whether a product is defective or not, when the resistance thereof is higher than a standard value. Hence, the risk of inadvertently selecting a defective product as being a good product may be reduced or avoided. On the other hand, when the resistance is less than the standard value (in spite of the inclusion of the contact resistances) the present invention naturally determines the product as being a good product.

Likewise, the present invention may also be used to detect the case in which the current terminal 6 or 7 is not in contact with the measurement object. When the current terminal 6 (the $H_c$ line) is not in contact with the measurement object, $R_M = V/I = R_{dut} + R_{HP}$. When the current terminal 7 (the $L_c$ line) is not in contact with the measurement object, $R_M = V/I = R_{dut} + R_{LP}$. Accordingly, the result is that the measurement may be considered to be effectively performed by means of a two-terminal method using the $H_p$ and $L_p$ lines.

Figure 5:
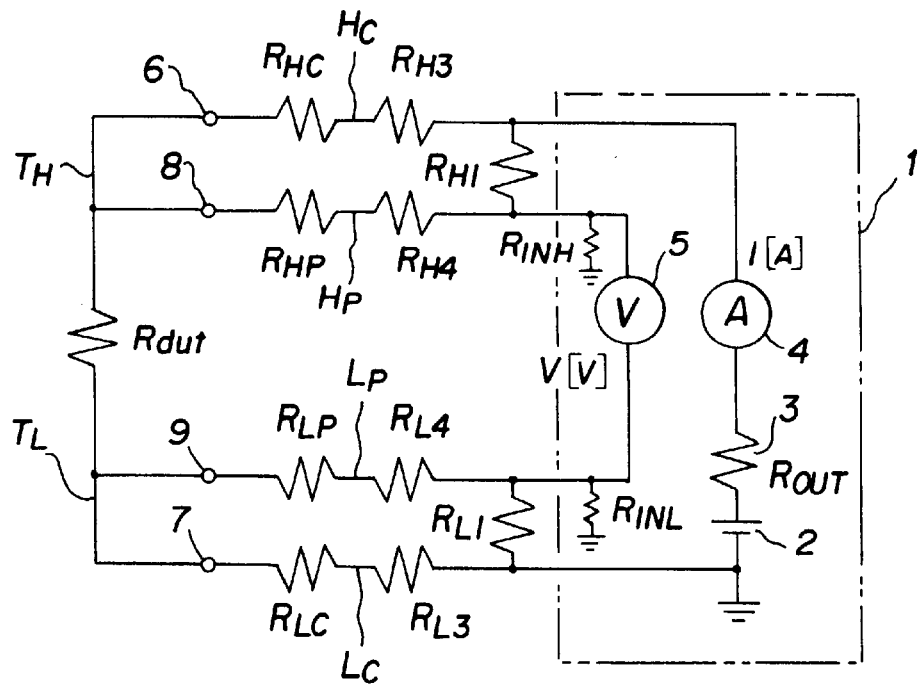
FIG. 5 is a circuit diagram of a second embodiment of the impedance measuring apparatus according to the present invention.

FIG. 5 shows a second embodiment of the measuring apparatus according to the present invention, which is an example in which a part of the measuring apparatus shown in FIG. 4 is modified. In accordance with this embodiment, the voltage detection lines or the current detection lines on which a contact failure occurs may be detected when the resistance of the measurement object is relatively low, based on the measured value.

A third resistor $R_{H3}$ is connected to the current-carrying line $H_c$ provided between one electrode $T_H$ of the measurement object $R_{dut}$ and the first resistor $R_{H1}$, and a fourth resistor $R_{L3}$ is connected to the current-carrying line $L_c$ provided between the other electrode $T_L$ thereof and the second resistor $R_{L1}$. A fifth resistor $R_{H4}$ is connected to the voltage detection line $H_p$ provided between one electrode $T_H$ thereof and the first resistor $R_{HC}$, and a sixth resistor $R_{L4}$ is connected to the voltage detection line $L_p$ provided between the other electrode $T_L$ thereof and the second resistor $R_{L1}$. The resistances of the third to the sixth resistors $R_{H3}$, $R_{L3}$, $R_{H4}$, and $R_{L4}$ are preferably each sufficiently lower than the resistances of the first and the second resistors $R_{H1}$ and $R_{L1}$, and are sufficiently higher than the resistances which are normal for the contact resistances $R_{HC}$, $R_{LC}$, $R_{HP}$, and $R_{LP}$. In addition, each of them is different from one another. That is, it is preferred that the resistances are related as follows.

$$R_{H1} \gg R_{H3}, R_{H4} \gg R_{HC}, R_{HP}$$

$$R_{L1} \gg R_{L3}, R_{L4} \gg R_{LC}, R_{LP}$$

For example, when $R_{dut}$ is about 100 m$\Omega$, when values which $R_{HC}$, $R_{LC}$, $R_{HP}$, and $R_{LP}$ can normally take are below 1 $\Omega$, and when $R_{H3}$=20 $\Omega$, $R_{L3}$=10 $\Omega$, $R_{H4}$=40 $\Omega$, and $R_{L4}$=80 $\Omega$, the measured value varies in accordance with the location of the occurrence of contact failure, and may be determined as follows. When contact failure occurs on the $H_p$ line, the measured value is in the 20 $\Omega$ region. When contact failure occurs on the $L_p$ line, the measured value is in the 10 $\Omega$ region. When contact failures occur on both of the $H_p$ line and the $L_p$ line, the measure value is in the 30 $\Omega$ region. When contact failure occurs on the $H_c$ line, the measured value is in the 40 $\Omega$ region. When contact failure occurs on the $L_c$ line, the measured value is in the 80 $\Omega$ region. When contact failure occurs on both of the $H_c$ line and the $L_c$ line, the measured value is in the 120 $\Omega$ region. As described above, the location of the occurrence of contact failure may be determined based on the measured value.

In a variation of the embodiment shown in FIG. 5, the resistors $R_{H4}$ and $R_{L4}$ need not be included. That is, although the current-carrying lines $H_c$ and $L_c$, and the voltage detection lines $H_p$ and $L_p$ are connected to the resistors $R_{H3}$, $R_{L3}$, $R_{H4}$, and $R_{L4}$, respectively, the resistors $R_{H4}$ and $R_{L4}$ provided on the current-carrying lines $H_c$ and $L_c$, respectively, can be omitted. This is due to the fact that the resistors $R_{H4}$ and $R_4$, which serve to detect contact failure on the current-carrying lines $H_c$ and/or $L_c$, bring about no measurement error as long as no contact failure occurs on either of the voltage detection lines $H_p$ and $L_p$.

Figure 6:
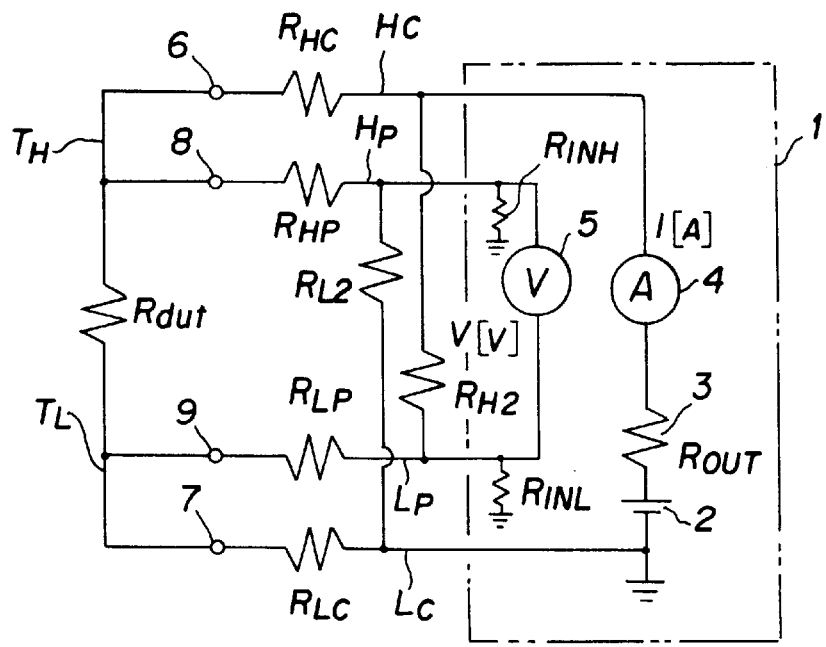
FIG. 6 is a circuit diagram of a third embodiment of the impedance measuring apparatus according to the present invention.

FIG. 6 shows a third embodiment of the impedance measuring apparatus according to the present invention. This measuring apparatus is used for estimation in a case in which a product is defective when the impedance thereof is lower than a standard value.

A first resistor $R_{H2}$ is connected among the current-carrying line $H_c$ connected to one electrode $T_H$ of the measurement object $R_{dut}$, the voltage detection line $L_p$ connected to the other electrode $T_L$. A second resistor $R_{L2}$ is connected between the current-carrying line $L_c$ connected to the other electrode $T_L$ and the voltage detection line $H_p$ connected to the electrode $T_H$. The resistances (for example, 50 k Ω) of these first and second resistors $R_{H2}$ and $R_{L2}$ are preferably set so as to be sufficiently higher than values (normally, equal to or below 10 Ω) which are normal for the contact resistances $R_{HC}$, $R_{LC}$, $R_{HP}$, and $R_{LP}$. That is, it is preferred that the resistances are related as follows.

$R_{H2} \gg R_{HC}, R_{HP}$ $R_{L2} \gg R_{LC}, R_{LP}$

In the measuring apparatus in FIG. 6, when contact failure occurs on the voltage detection lines $H_p$ and/or $L_p$, the measured value $R_M$ is typically related as follows.

$R_M = -R_{LC}$ (when the $H_p$ line is not in contact)

$R_M = -R_{HC}$ (when the $L_p$ line is not in contact)

$R_M = -R_{dut} - R_{LC} - R_{HC}$ (when neither $H_p$ nor $L_p$ is in contact)

Accordingly, when contact failure occurs on the voltage detection lines $H_p$ and $L_p$ in this manner, by pulling-down the voltage detection lines, the measured value decreases. Hence, in a manner of selection in which a product is judged to be defective when the resistance of the product is less than a standard value, the risk of inadvertently selecting a defective product as being a good product may be reduced or avoided.

Figure 7:
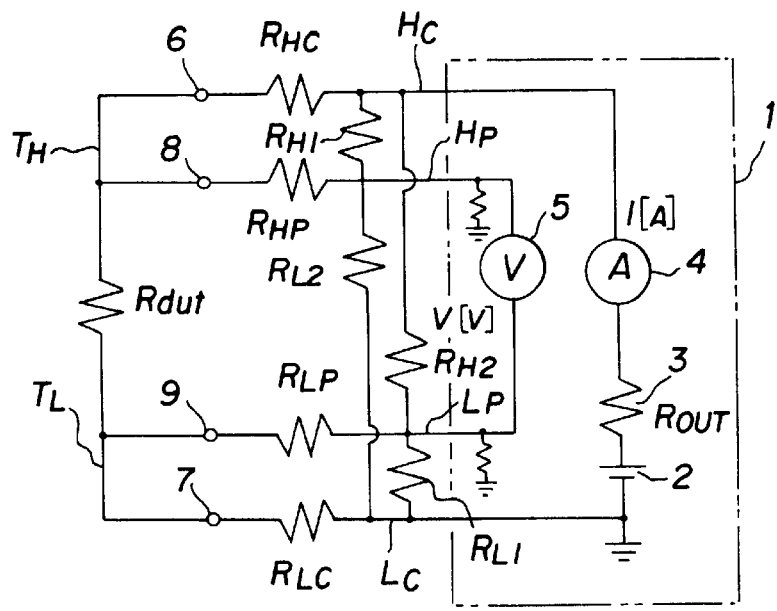
FIG. 7 is a circuit diagram of a fourth embodiment of the impedance measuring apparatus according to the present invention.

FIG. 7 shows a fourth embodiment of the impedance measuring apparatus according to the present invention, wherein the fourth embodiment is a variation of the embodiment in FIG. 6. In FIG. 6, when contact failure occurs, a measured value may be negative in some cases. In those instances that it is desired for the measured value to be positive, or in the case in which the measured value is desired to be in the proximity of a predetermined resistance even though contact failure occurs, as shown in FIG. 7, the resistors $R_{H1}$ and $R_{L1}$ are each preferably connected between the corresponding current-carrying lines and the corresponding voltage detection lines that are in contact with the same electrodes in addition to the resistors $R_{H2}$ and $R_{L2}$. The resistances (for example, 100 k Ω) of these resistors $R_{H1}$ and $R_{L1}$ are preferably set so as to be sufficiently higher than values (normally, equal to or below 10 Ω) which are normal for the contact resistances $R_{HC}$, $R_{LC}$, $R_{HP}$, and $R_{LP}$.

In the above-described measuring apparatus, when contact failure occurs on the voltage detection lines $H_p$ and/or $L_p$, the measured value can be seemingly offset to some extent by causing the voltmeter 5 to detect what is obtained by voltage-dividing the applied voltage using these resistors $R_{H1}$, $R_{L1}$, $R_{H2}$, and $R_{L2}$. These resistances and the voltage-divided ratio are selected in accordance with the measurement object $R_{dut}$.

Figure 8:
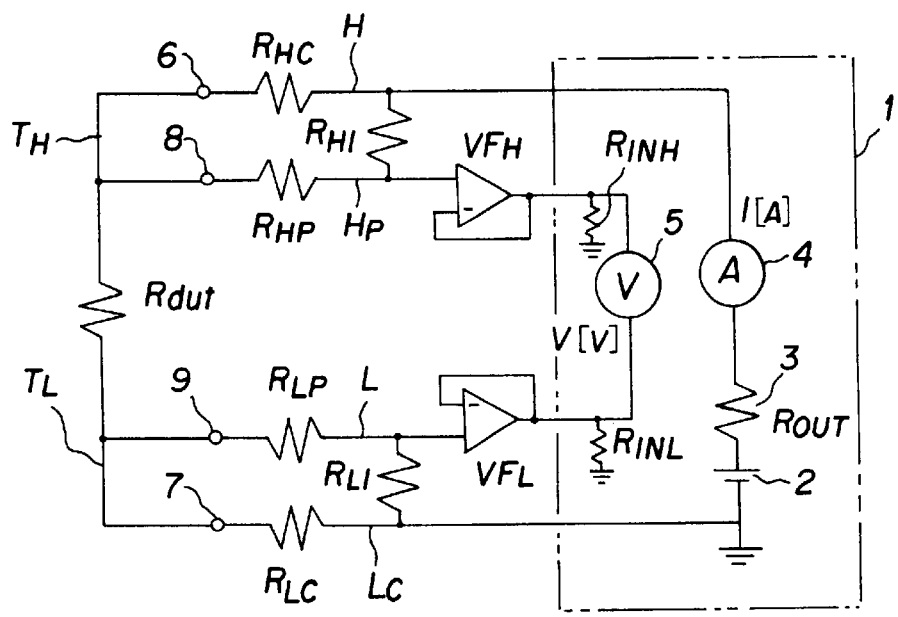
FIG. 8 is a circuit diagram of a fifth embodiment of the impedance measuring apparatus according to the present invention.

FIG. 8 shows a fifth embodiment of the impedance measuring apparatus according to the present invention.

As shown in the first to the fourth embodiments, in order to actually use a method in which the voltage detection lines are pulled-up or pulled-down, it is preferred that the input impedances $R_{INH}$ and $R_{INL}$ of the voltage detection unit of the measuring apparatus 1 be sufficiently high. For example, there is a case in which a measuring apparatus has a high input impedance for a DC signal, yet has a low input impedance for an AC signal due to input capacitance. In addition, there is a case in which the input impedance of the measuring apparatus is lowered due to stray capacitance of a measurement cable. In these cases, when, as shown in the first to the fourth embodiments, contact resistances are added to be in series with the corresponding voltage detection lines $H_p$ and $L_p$, the measurement error increases.

Accordingly, in this embodiment, voltage followers $VF_H$ and $VF_L$ having high input impedances are inserted ahead of the voltage detection unit ($H_p$, $L_p$) of the measuring apparatus 1, whereby the measurement error due to contact resistances decreases. The voltage followers $VF_H$ and $VF_L$ serve to greatly enhance the input impedance of the measurement system observed from the measurement object side as well as to greatly reduce output impedance of the measurement object observed from the measuring-apparatus side (impedance conversion). In order to avoid the occurrence of unnecessary noise, a low-noise type operational amplifier or the like is desired to be used to form the voltage followers $VF_H$ and $VH_L$.

FIG. 8 shows an embodiment in which the voltage followers $VF_H$ and $VF_L$ are applied to the embodiment shown in FIG. 4. In the same manner, the voltage followers can be applied to the embodiments in FIGS. 5, 6 and 7.

In addition, it is effective that the voltage followers $VF_H$ and $VF_L$ are provided on the higher-voltage detection side of the voltage detection lines $H_p$ and $L_p$.

It should be understood that the present disclosure of preferred forms of the present invention are exemplary and not limited in every respect. The scope of the invention is defined by the appended claims rather than by the description preceding them, and all changes that fall within the scope of the claims, or equivalence of such scope of the claims, are intended to be included by the claims.

What is claimed is:

1. An impedance measuring apparatus, including at least a voltmeter and an ammeter; for measuring impedance of an electronic component using a four-terminal method, the impedance measuring apparatus for the electronic component comprising:

a first current-carrying line connected between one electrode of said electronic component and the ammeter and a first voltage detection line connected between said one electrode of said electronic component and the voltmeter;

a first resistor establishing a connection between said first current-carrying line and said first voltage detection line;

a second current-carrying line connected between the other electrode of said electronic component and the ammeter and a second voltage detection line connected between the other electrode of said electronic component and the voltmeter; and a second resistor establishing a connection between said second current-carrying line and said second voltage detection line, wherein said first resistor and said second resistor have resistances which are larger than contact resistances occurring a) between the electrodes of said electronic component and the current-carrying lines, and b) between the electrodes of said electronic component and the voltage detection lines.

2. The impedance measuring apparatus for an electronic component according to claim 1, further comprising:

a third resistor connected to said first current-carrying line provided between the one electrode of said electronic component and said first resistor; and a fourth resistor connected to said second current-carrying line provided between the other electrode of said electronic component and said second resistor, wherein resistances of said third resistor and said fourth resistor are sufficiently low compared to the resistances of said first resistor and said second resistor, are sufficiently high compared to the contact resistances occurring among the electrodes of said electronic component, the current-carrying lines, and the voltage detection lines, and are different from each other.

3. The impedance measuring apparatus for an electronic component according to claim 1, further comprising:
  a voltage follower having a high input impedance and inserted on at least the higher-voltage detection side of the voltage detection lines provided among said first resistor, said second resistor, and the measuring apparatus.

4. An impedance measuring apparatus for measuring the impedance of an electronic component by using a four-terminal method, said impedance measuring apparatus comprising:
  a first current-carrying line and a first voltage detection line which are connected to one electrode of the electronic component;
  a first resistor for connecting said first current-carrying line and said first voltage detection line;
  a second current-carrying line and a second voltage detection line which are connected to the other electrode of the electronic component;
  a second resistor for connecting said second current-carrying line and said second voltage detection line;
  a third resistor connected to a portion of said first current-carrying line between said one terminal of the electronic component and said first resistor; and
  a fourth resistor connected to a portion of said second current-carrying line between the other terminal of the electronic component and said second resistor;
  wherein:
    the first and second resistors each have resistance sufficiently larger than each of a first contact resistance between said one electrode of the electronic component and said first current-carrying line, a second contact resistance between the other electrode of the electronic component and said second current-carrying line, a third contact resistance between said one electrode of the electronic component and said first voltage detection line, and a fourth contact resistance between the other electrode of the electronic component and said second voltage detection line;
    the third and fourth resistors each have a resistance sufficiently smaller than each of the resistances of the first and second resistors and each have a resistance sufficiently larger than each of the first to fourth contact resistances, and have different resistances.

5. An impedance measuring apparatus according to claim 3, further comprising:
  a fifth resistor connected to a portion of said first voltage detection line between said one terminal of the electronic component and said first resistor;
  a sixth resistor connected to a portion of said second voltage detection line between the other terminal of the electronic component and said second resistor,
  wherein:
    the fifth and sixth resistors each have a resistance sufficiently smaller than each of the resistances of the first and second resistors, and each have a resistance sufficiently larger than each of the first to fourth contact resistances; and
    the third to sixth resistors have different resistances.

6. An impedance measuring apparatus for measuring the impedance of an electronic component by using a four-terminal method, said impedance measuring apparatus comprising:
  a first current-carrying line connected to one terminal of the electronic component;
  a first voltage detection line connected to the other terminal of the electronic component;
  a first resistor for connecting said first current-carrying line and said first voltage detection line;
  a second current-carrying line connected to the other terminal of the electronic component;
  a second voltage detection line connected to said one terminal of the electronic component; and
  a second resistor for connecting said second current-carrying line and said second voltage detection line,
  wherein the first and second resistors each have a resistance sufficiently larger than each of the first contact resistance between said one electrode of the electronic component and said first current-carrying line, a second contact resistance between the other electrode of the electronic component and said second current-carrying line, a third contact resistance between said one electrode of the electronic component and said first voltage detection line, and a fourth contact resistance between the other electrode of the electronic component and said second voltage detection line.

7. An impedance measuring apparatus according to claim 6, further comprising third and fourth resistors each respectively connecting the first and second current carrying lines connecting the current-carrying line and the voltage detection line which are connected to the same electrode of the electronic component,
  wherein the third and fourth resistors of each have a resistance sufficiently larger than each of the first to fourth contact resistances.

* * * * *